(12) United States Patent
Parker

(10) Patent No.: US 7,437,638 B2
(45) Date of Patent: Oct. 14, 2008

(54) BOUNDARY-SCAN METHODS AND APPARATUS

(75) Inventor: Kenneth P. Parker, Fort Collins, CO (US)

(73) Assignee: Agilent Technologies, Inc., Santa Clara, CA (US)

( * ) Notice: Subject to any disclaimer, the term of this patent is extended or adjusted under 35 U.S.C. 154(b) by 853 days.

(21) Appl. No.: 10/292,267

(22) Filed: Nov. 12, 2002

(65) Prior Publication Data

US 2004/0093543 A1    May 13, 2004

(51) Int. Cl.
*G01R 31/28* (2006.01)

(52) U.S. Cl. .................. 714/727; 714/30; 714/724; 714/732; 714/726; 714/729; 714/742

(58) Field of Classification Search ............... 714/727, 714/732, 724
See application file for complete search history.

(56) References Cited

U.S. PATENT DOCUMENTS

| | | | |
|---|---|---|---|
| 4,183,460 A | 1/1980 | Yuen et al. | |
| 4,853,928 A | 8/1989 | Williams | |
| 5,627,842 A * | 5/1997 | Brown et al. | ................. 714/727 |
| 5,909,452 A * | 6/1999 | Angelotti | .................... 714/726 |
| 6,067,651 A | 5/2000 | Rohrbaugh et al. | |
| 6,327,684 B1 * | 12/2001 | Nadeau-Dostie et al. | .... 714/731 |
| 6,556,037 B2 | 4/2003 | Shiraishi | |
| 6,662,324 B1 * | 12/2003 | Motika et al. | ............... 714/726 |
| 6,671,839 B1 * | 12/2003 | Cote et al. | .................. 714/726 |
| 6,725,435 B2 * | 4/2004 | Cote et al. | ...................... 716/5 |
| 6,813,737 B1 * | 11/2004 | Srinivasaiah et al. | ........ 714/726 |

OTHER PUBLICATIONS

Kenneth P. Parker, "The Boundary-Scan Handbook: Analog and Digital", 2nd edition, Sep. 1998, pp. 122-131.
"Draft Standard for Boundary-Scan Testing of Advanced Digital Networks", IEEE P1149.6 Draft 3.1 (Jun. 4, 2002), pp. 1-110.
Eklow, et al.; "A Boundary-Scan Standard for Advanced Digital Networks"; IEEE, Apr. 2002; pp. 1056-1065.

* cited by examiner

*Primary Examiner*—John P Trimmings

(57) ABSTRACT

Disclosed herein are various methods and apparatus related to Boundary-Scan testing, including a method for generating Boundary-Scan test vectors. The method assigns different binary signatures to all of the drivers and hysteretic test receiver memories of a circuit assembly under test, and then generates a series of Boundary-Scan test vectors wherein each test vector is derived from corresponding bits of the binary signatures.

10 Claims, 7 Drawing Sheets

US 7,437,638 B2

BOUNDARY-SCAN METHODS AND APPARATUS

FIELD OF THE INVENTION

The invention pertains to Boundary-Scan testing, and particularly, to Boundary-Scan testing of circuit assemblies comprising AC coupled networks.

BACKGROUND OF THE INVENTION

A common way to diagnose interconnect defects (e.g., shorts and opens) in circuit assemblies (e.g., printed circuit boards, Multi-Chip Modules, and Silicon-in-Package devices) is via Boundary-Scan testing. A standard for Boundary-Scan testing is defined in IEEE Standard 1149.1.

As the electronics industry has moved forward with the implementation of AC coupled networks, IEEE Std. 1149.1 has become out-of-date. This is because IEEE Std. 1149.1 was drafted at a time when DC coupled networks were the norm. In an AC coupled network, for example, series capacitors are used to block DC current flow along a signal path, thereby allowing only AC signals to pass. A standard that defines how to apply Boundary-Scan techniques to AC networks is therefore needed. To this end, work is underway on IEEE Std. P1149.6—a draft standard that addresses Boundary-Scan testing of circuit assemblies comprising AC coupled networks.

SUMMARY OF THE INVENTION

One aspect of the invention is embodied in a method for generating Boundary-Scan test vectors. The method comprises 1) assigning different binary signatures to all of the drivers and hysteretic test receiver memories of a circuit assembly under test, and 2) generating a series of Boundary-Scan test vectors wherein each test vector comprises corresponding bits of the binary signatures.

Another aspect of the invention is embodied in apparatus for evaluating a circuit assembly under test for interconnect defects. The apparatus comprises a number of computer readable media, and computer readable program code stored on the number of computer readable media. The computer readable program code receives 1) a set of unique binary signatures comprising data signatures assigned to drivers, and initialization signatures assigned to hysteretic test receiver memories, of the circuit assembly under test, and 2) a set of binary signatures captured from the hysteretic test receiver memories during Boundary-Scan testing. In response to these inputs, the code then evaluates the circuit assembly under test for interconnect defects by comparing each of the captured binary signatures to one or more of the unique binary data and initialization signatures.

Other embodiments of the invention are also disclosed.

BRIEF DESCRIPTION OF THE DRAWINGS

Illustrative and presently preferred embodiments of the invention are illustrated in the drawings in which:

FIG. 5 illustrates an exemplary series of test vectors;

DESCRIPTION OF THE PREFERRED EMBODIMENT

Figure 1:
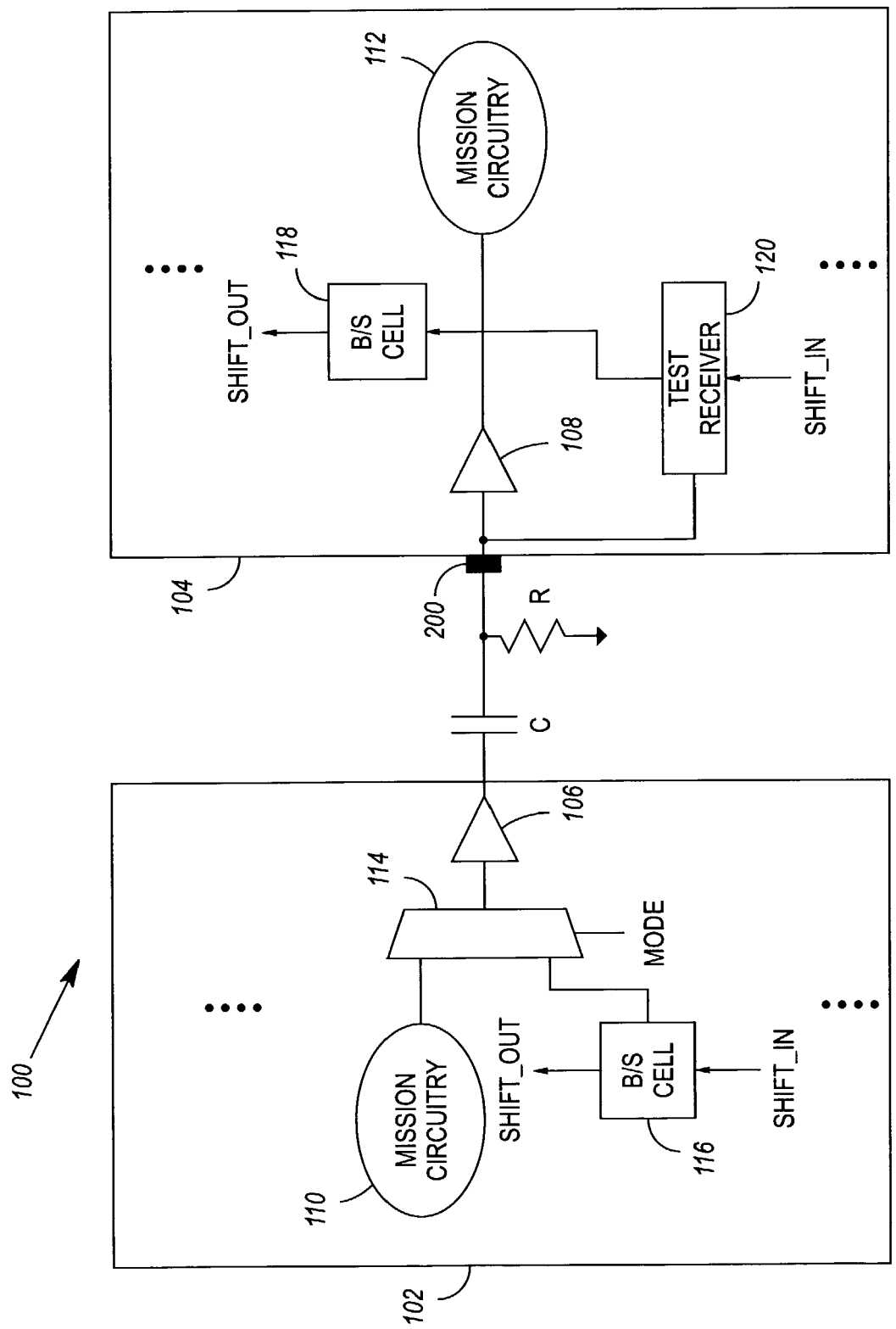
FIG. 1 illustrates an exemplary circuit assembly comprising an AC coupled network.

FIG. 1 illustrates an exemplary circuit assembly 100 comprising an AC coupled network. The AC network couples a driver 106 of a first device 102 to a receiver 108 of a second device 104. By way of example, the two devices 102, 104 could be integrated circuits (ICs). The devices 102, 104 might be coupled via an AC network for a variety of reasons, such as their use of incompatible DC signal levels. In the case of incompatible DC signal levels, the receiver 108 of the second device 104 would incorporate a biasing network for the purpose of establishing its own preferred operating point, typically at the midpoint of its logic swing.

The AC coupling of the FIG. 1 circuit assembly 100 comprises a capacitor (C) that is coupled in series with the driver 106 of the first device 102 and the receiver 108 of the second device 104. The AC coupling might further comprise a termination resistor (R).

Although FIG. 1 only illustrates one AC coupling between the devices 102, 104 shown, in practice, the two devices 102, 104 would likely be coupled by a plurality of AC couplings, and quite possibly, a mix of AC and DC couplings.

Because AC couplings will not pass DC voltage levels, the receiver 108 in the second device 104 will see capacitive decay in transmitted signals if the rate of change of the transmitted signals is low compared to the time constant (R*C) of the coupling. Signals must therefore be transmitted at a high enough frequency, and with frequent enough transitions, so as to mitigate signal decay. To this end, the mission circuitry 110 of a transmitting device 102 will typically encode data in such a way that frequent signal transitions are assured, thus "conditioning" the AC coupling for data transfer.

Unfortunately, the transient nature of an AC coupling makes it difficult, if not impossible, to test the coupling using the Boundary-Scan principles set forth in IEEE Std. 1149.1 (sometimes referred to herein as the "1149.1 standard"). The 1149.1 standard contemplates the transmission of DC signal levels between drivers 106 and receivers 120. Although the DC signal levels are periodically changed, there is no requirement that the signal levels be changed with any particular frequency. As a result, the time between signal level changes is typically quite long in comparison to the time constant of an AC coupling. The length of time between signal level changes is due to a combination of factors, including: the frequency of the Boundary-Scan test clock (TCK) being orders of magnitude slower than a device's mission clock frequency, and a need to frequently interrupt the test clock for the processing of test system overhead functions. Since low frequency signals transmitted through an AC coupling tend to decay, conventional Boundary-Scan testing of AC coupled networks is unreliable at best, and often not even practical.

A standard for applying Boundary-Scan techniques to AC coupled networks is in the process of being developed. The preliminary draft of the standard has been identified as IEEE Std. P1149.6. The standard contemplates the creation of an AC waveform that is propagated between a mission driver 106 and a test receiver 120. Because of the variability of test clock rates and the amount of data shifting involved, the AC waveform may still be of a low frequency. However, the waveform is constructed such that each test bit sent via the waveform comprises at least two waveform edges-first the intended test bit is sent, followed by the complement of the test bit, followed by the intended test bit again.

Figure 2:
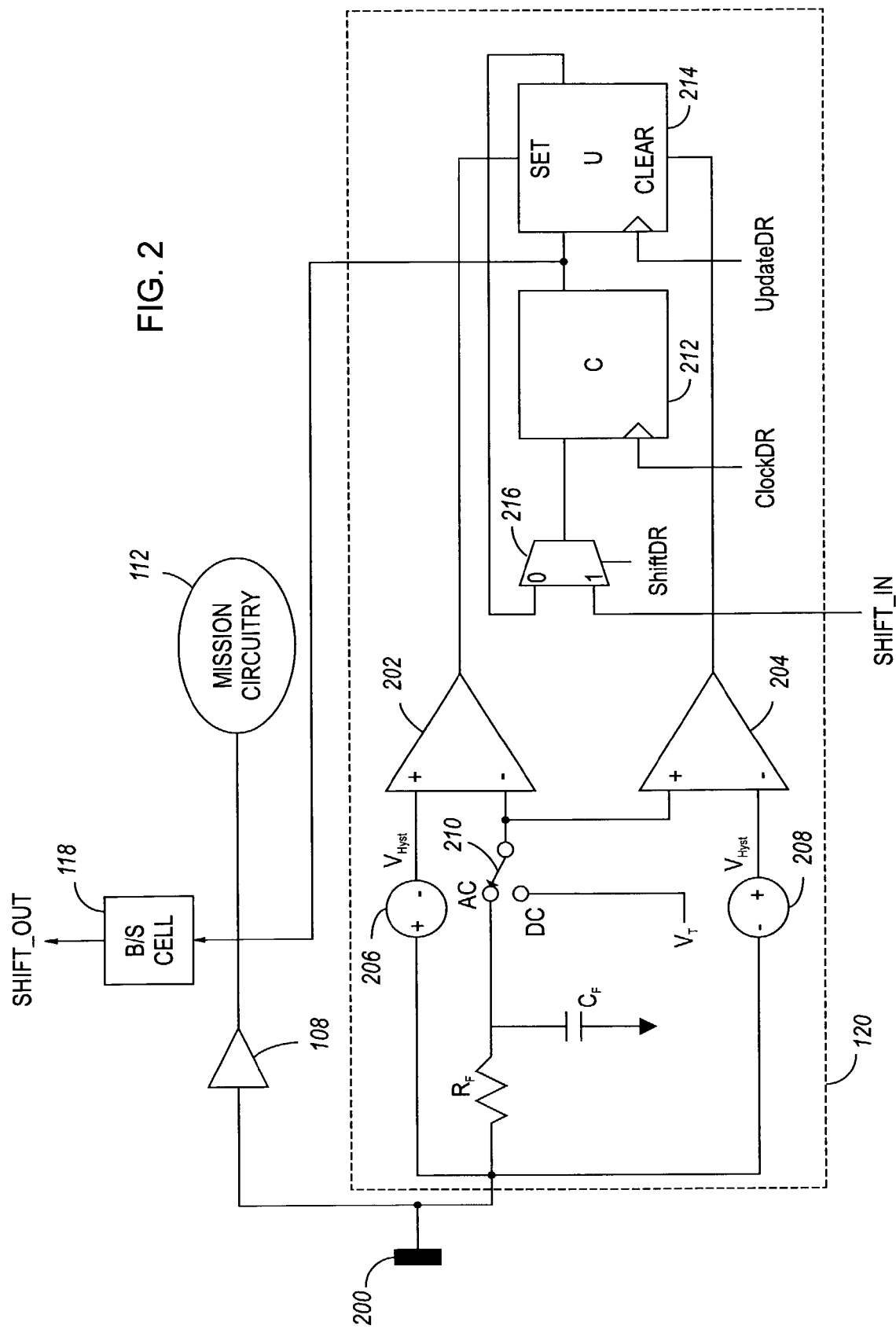
FIG. 2 illustrates an exemplary embodiment of the test receiver shown in FIG. 1.

As illustrated in FIG. 2, the test receiver 120 contemplated by IEEE Std. P1149.6 comprises rising and falling edge detectors 202, 204 which are used to "reconstruct" an original waveform from the edges of the waveform that pass through an AC coupling. Thus, even though the DC levels produced by a driver 106 may decay, an "original" waveform may still be reconstructed by the test receiver 120. Thus, Boundary-Scan "thinks" it is testing with levels, but in reality, an AC waveform crosses over an AC coupling, and an integrator reconstructs the original waveform from its edge information.

Referring to the FIG. 2 test receiver 120 in more detail, one notices that the receiver 120 comprises two op-amps 202, 204. The upper op-amp 202 is a leading edge detector that "sets" the flip-flop 214 marked "U". The lower op-amp 204 is a falling edge detector that "resets" the "U" flip-flop 214. Thus, an AC waveform seen in differentiated form at pin 200 is reconstructed at the output of the "U" flip-flop 214 (i.e., so long as switch 210 is in its "AC" position). The two voltage sources ($V_{Hyst}$) 206, 208 provide noise immunity that prevents small signal noise from being integrated. The low-pass filter ($R_F/C_F$) holds the recent, average value of the incoming waveform so that the edge detectors 202, 204 can compare this value to the instantaneous value of the incoming waveform. Thus, if a signal edge arrives at pin 200, and then slowly decays, the signal edge will set (or reset) the "U" flip-flop 214. The "U" flip-flop 214 can be thought of as a "hysteretic" memory (or hysteretic test receiver memory) in that it retains the state of the last valid signal level received by the test receiver 120—even after the signal level has decayed and may no longer exist.

During Boundary-Scan testing, the signal levels (i.e., data values) stored in the "U" flip-flop 214 need to be captured and evaluated. If the "U" flip-flop 214 is equated with the Update flip-flop of a conventional Boundary-Scan cell, then its output may be linked to the input of a Capture flip-flop (i.e., the "C" flip-flop 212 in FIG. 2). From there, data may be shifted out of the test receiver 120. Depending on the position of the Capture flip-flop 212 in a Boundary-Scan register, its data may be shifted through other Boundary-Scan cells (e.g., cell 118, as well as other cells connected to SHIFT_OUT).

The Boundary-Scan cell 212-216 further comprises a multiplexer 216. A first path through the multiplexer links the output of the Update flip-flop 214 to the input of the Capture flip-flop 212. A second path through the multiplexer links the input of the Capture flip-flop 212 to upstream Boundary-Scan cells forming a part of the afore-mentioned Boundary-Scan register (i.e., cells connected to SHIFT_IN). A control signal (ShiftDR) determines which of the two paths is active. If the second path is active (ShiftDR=1), data appearing at SHIFT_IN may be shifted into the Capture flip-flop 212 in sync with the control signal ClockDR, and then loaded into the Update flip-flop 214 (i.e., the hysteretic test receiver memory) in sync with the control signal UpdateDR.

During Boundary-Scan testing, the hysteretic memory 214 of a test receiver 120 is preferably "preset" or "initialized" to a known state. This is a relatively easy task when the test receiver 120 incorporates a Boundary-Scan cell 212, 214, 216 —a known initial state is merely merged into a Boundary-Scan test vector, shifted into a test receiver's Boundary-Scan cell, and then loaded into the test receiver's hysteretic memory 214. The shifting and loading of a test vector may be accomplished via Boundary-Scan instructions such as PRELOAD or EXTEST.

Although IEEE Std. P1149.6 discusses the need to initialize hysteretic test receiver memories 214, and discloses that initialization can be accomplished by means of Boundary-Scan test vectors, the draft standard provides little guidance on "choosing" a hysteretic memory's initial state(s).

Mere "initialization" of hysteretic memories 214 is not enough to ensure adequate failure diagnosis of a circuit assembly under test. For example, if a hysteretic test receiver memory 214 is initialized to a logic low, and its initialized value does not change, there is no way to determine whether 1) the memory 214 has been "reset" to a logic low, or 2) the memory 214 has merely retained its initialization value. Likewise, if the memory 214 is initialized to a logic high, there is no way to determine whether 1) the memory 214 has been "set" to a logic high, or 2) the memory 214 has merely retained its initialization value. Thus, some way of choosing a hysteretic memory's state at each opportunity to preset the memory 214 is needed.

Figure 3:
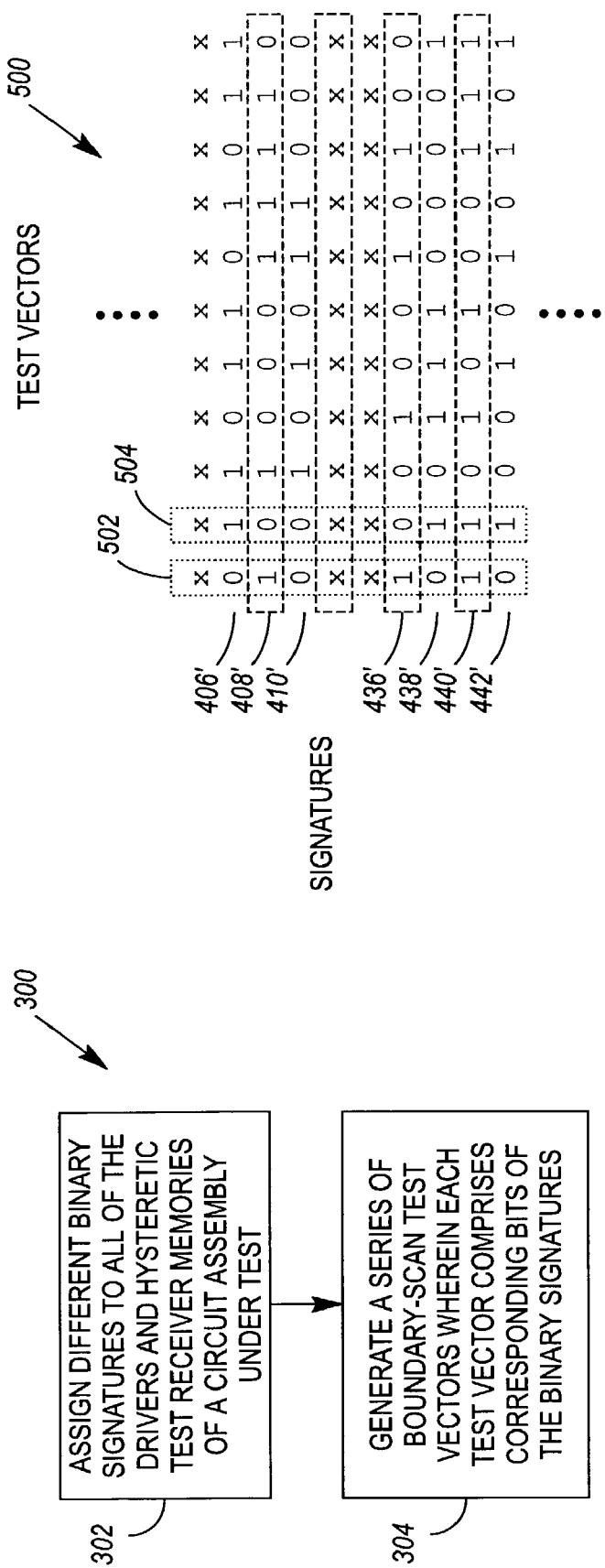
FIG. 3 illustrates a first exemplary method for generating Boundary-Scan test vectors.

In recognition of the above need, FIG. 3 illustrates a first exemplary method 300 for generating Boundary-Scan test vectors. The method 300 commences with the assignment 302 of different binary signatures to all of the drivers and hysteretic test receiver memories of a circuit assembly under test. A series of Boundary-Scan test vectors is then generated 304, wherein each test vector comprises corresponding bits of the binary signatures.

Figure 4:
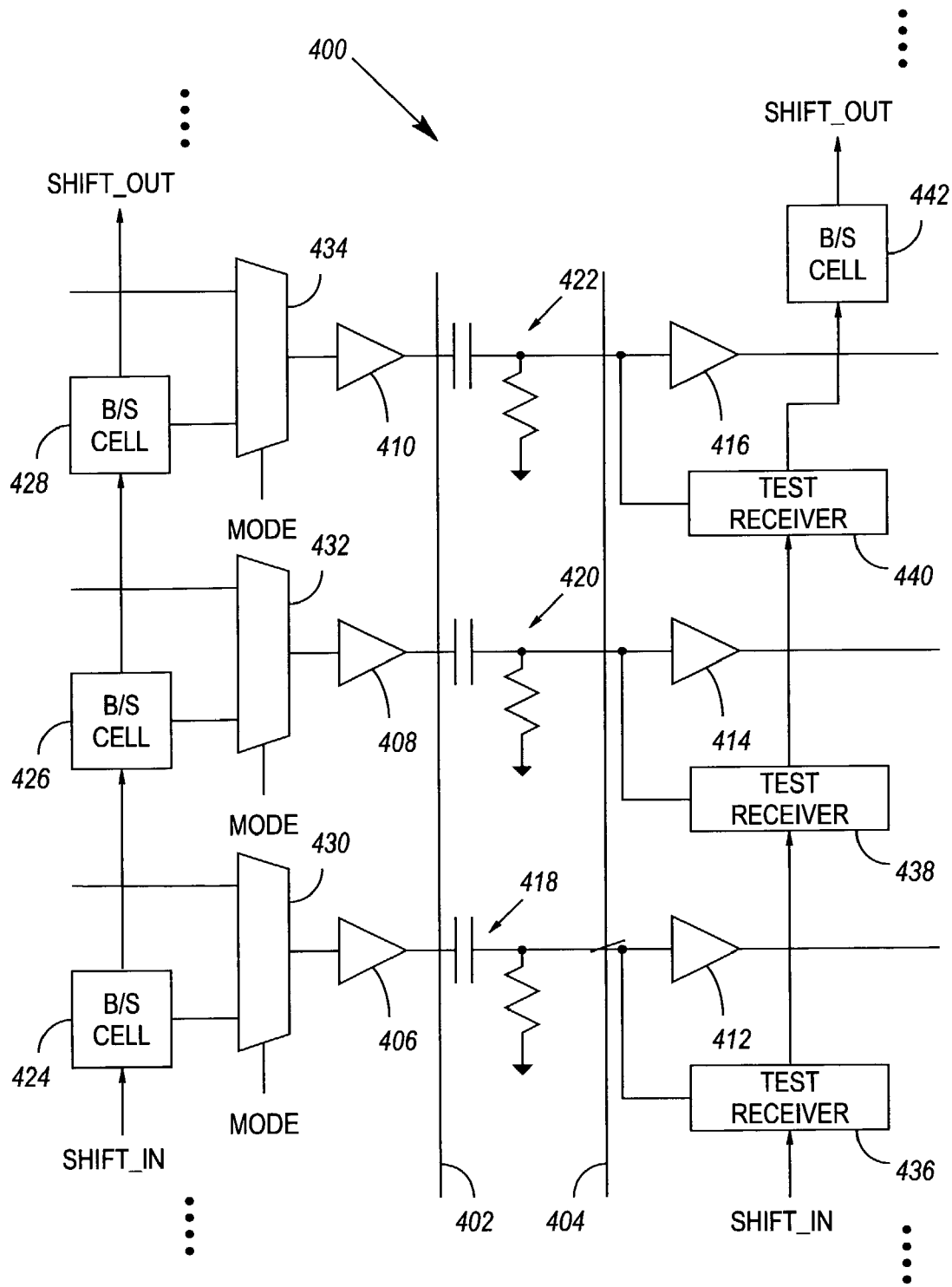
FIG. 4 illustrates an exemplary portion of a circuit assembly under test.

FIGS. 4 & 5 illustrate how the FIG. 3 method might actually be applied to a circuit assembly under test. FIG. 4 illustrates a portion 400 of the circuit assembly under test. The circuit assembly under test comprises two devices 402, 404, one of which comprises three drivers 406, 408, 410, and one of which comprises three receivers 412, 414, 416. Each of the drivers 406, 408, 410 is coupled to a corresponding receiver 412, 414, 416 via an AC coupling 418, 420, 422.

Each driver 406, 408, 410 is coupled to a corresponding Boundary-Scan cell 424, 426, 428 via a mulitplexer 430, 432, 434. The multiplexers 430, 432, 434 alternately couple the drivers 406, 408, 410 to their corresponding Boundary-Scan cells 424, 426, 428, or to mission logic, depending on the state of a MODE signal.

Coupled to the input of each receiver 412, 414, 416 is a corresponding test receiver 436, 438, 440. Each test receiver 436, 438, 440 may be configured as shown in FIG. 2 (or in other ways) and comprises hysteretic memory that is integrated with a Boundary-Scan cell.

The Boundary-Scan cells of a circuit assembly under test may be linked via any number of scan chains. By way of example, FIG. 4 illustrates a first scan chain linking the driver cells 424, 426, 428 of one device 402 and a second chain linking the test receiver cells 436, 438, 440 of another device 404. Also by way of example, FIG. 4 illustrates the second scan chain's inclusion of a "non-test receiver" Boundary-Scan cell 442 (e.g., a Boundary-Scan cell that monitors the output of a DC coupled receiver). The "non-test receiver" Boundary-Scan cell 442 illustrates that non-uniform types of Boundary-Scan cells 436, 438, 440, 442 may be linked together in the same scan chain.

FIG. 5 illustrates the various binary signatures 406', 408', 410', 436', 438', 440', 442' that may be assigned to the drivers and hysteretic test receiver memories of the circuit assembly under test in FIG. 4. The signatures 406', 408', 410', 436', 438', 440', 442' read from left-to-right and are identified by the prime of their corresponding driver's or test receiver's reference number. Thus, the binary signature 406' assigned to driver 406 is "01101101011". As indicated by FIG. 5's ellipses, only a portion of the signatures assigned to a circuit assembly under test are shown. The "x"s in FIG. 5 are not intended to be "don't cares", but rather reflect signatures corresponding to Boundary-Scan cells that are not shown in FIG. 5.

After each driver and hysteretic test receiver memory has been assigned a signature, a series of Boundary-Scan test vectors 502, 504 may be generated by grouping corresponding bits of the signatures.

Figure 6:
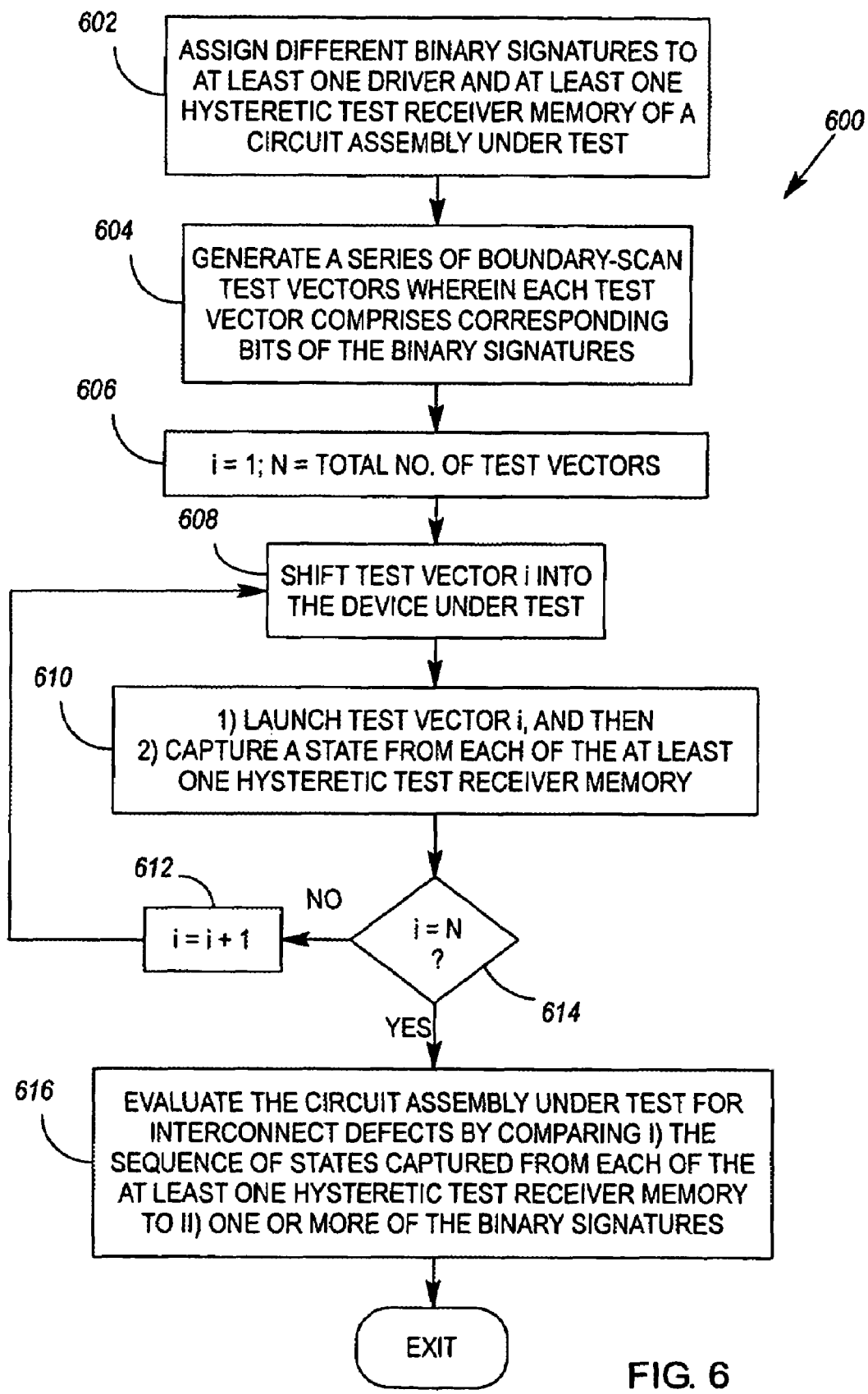
FIG. 6 illustrates an exemplary method for evaluating a circuit assembly under test for interconnect defects.

Having generated a series of Boundary-Scan test vectors 502, 504, the vectors may then be used to evaluate a circuit assembly under test for interconnect defects. FIG. 6 illustrates such a method 600. The method 600 begins similarly to the method illustrated in FIG. 3. That is, different binary signatures are assigned 602 to at least one driver and at least one hysteretic test receiver memory of the circuit assembly under test, and then a series of Boundary-Scan test vectors is generated 604 (wherein each test vector comprises corresponding bits of the binary signatures). Thereafter, the test vectors are shifted 606, 608, 612, 614 into a circuit assembly under test. For the purpose of this disclosure, bits of a test vector are considered shifted into a driver (e.g., driver 406, FIG. 4) when they are shifted into the driver's corresponding Boundary-Scan cell (e.g., cell 424).

After shifting each test vector into the circuit assembly under test, the test vector is launched 610, and a state is captured 610 from each of the circuit assembly's hysteretic test receiver memories 436, 438, 440. The circuit assembly under test may then be evaluated 616 for interconnect defects by comparing 1) the sequence of states captured from each hysteretic test receiver memory to 2) one or more of the binary signatures.

Figure 7:
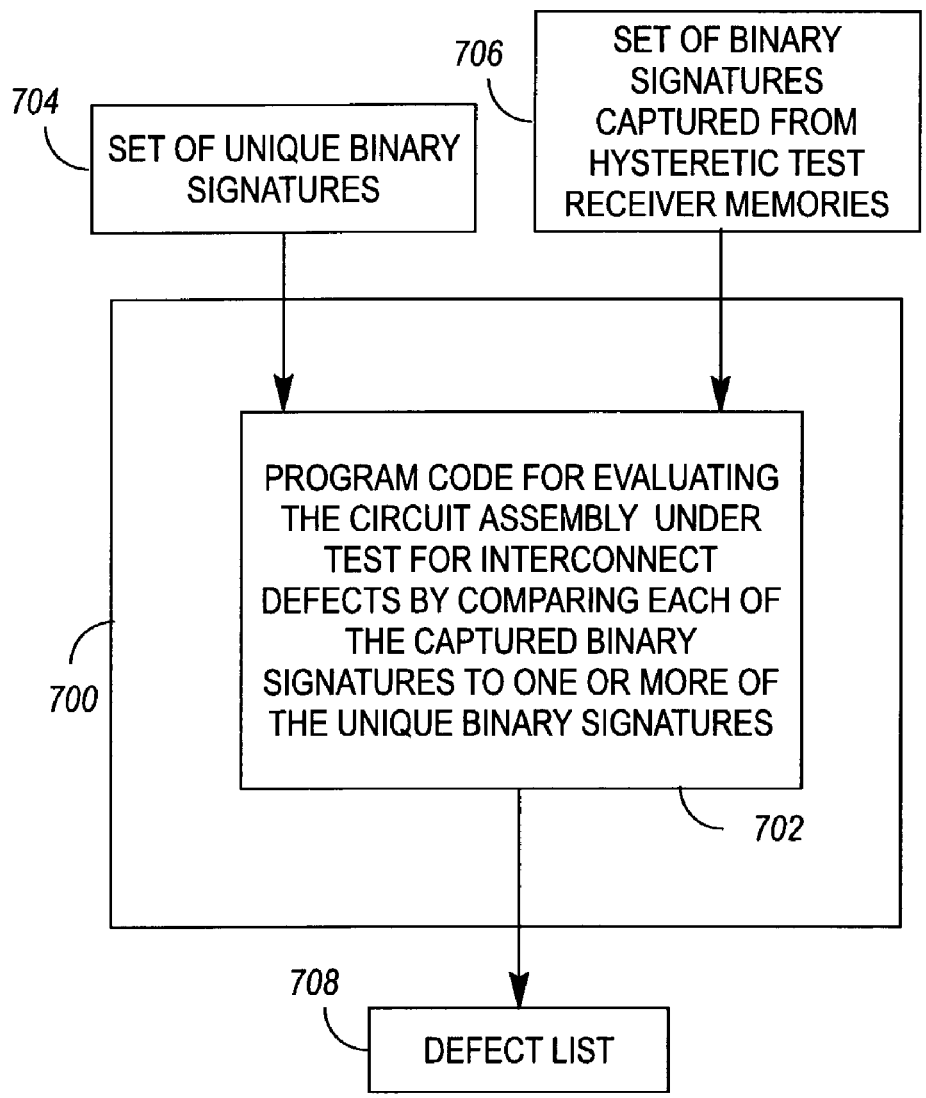
FIG. 7 illustrates an exemplary embodiment of apparatus for evaluating a circuit assembly under test for interconnect defects.

Apparatus for evaluating a circuit assembly under test for interconnect defects is shown in FIG. 7. The apparatus is embodied in computer readable program code 702 stored on a number of computer readable media 700. The computer readable program code 702 receives 1) a set of unique binary signatures 704 comprising data signatures assigned to drivers, and initialization signatures assigned to hysteretic test receiver memories, of the circuit assembly under test, and 2) a set of binary signatures 706 captured from the hysteretic test receiver memories during Boundary-Scan testing. The unique binary signatures 704 may be generated in accordance with the methods of FIG. 3 or FIG. 5, for example. The captured binary signatures 706 are equivalent to the sequences of captured states disclosed in FIG. 5.

The FIG. 7 apparatus evaluates the circuit assembly under test for interconnect defects by comparing the captured binary signatures it receives to one or more of the unique binary data and initialization signatures it receives. Since each driver and hysteretic test receiver memory is assigned a unique binary signature, the binary signature captured from a hysteretic test receiver memory should match the unique binary data signature of its corresponding driver. If the two signatures do not match, the FIG. 7 apparatus notes an interconnect defect.

If an interconnect defect is noted, additional steps may be taken to determine the type of interconnect defect. For example, the binary signature captured from a hysteretic test receiver memory may be compared to the unique binary data signatures for one or more drivers, and a short may be noted if any two signatures match. The binary signature captured from a hysteretic test receiver memory may also be compared to the unique binary initialization signatures for one or more other hysteretic receiver memories, with a short again being noted if any two signatures match. The binary signature captured from a hysteretic test receiver memory may be further compared to its own unique binary initialization signature, with an open being noted if the two signatures match.

To ensure that the state of a hysteretic test receiver memory is frequently "wiggled", the binary signature assigned to a hysteretic test receiver memory may be selected such that it is the complement of a sequence of states that is expected to be captured from the hysteretic test receiver memory as a series of test vectors is launched in a circuit assembly under test. Put another way, and assuming that a hysteretic test receiver memory is non-inverting, the signature assigned to the hysteretic test receiver memory may be selected such that it is the complement of the signature assigned to its corresponding driver. In this manner, the evaluation apparatus illustrated in FIG. 7 may determine if the binary signature captured from a hysteretic test receiver memory is the complement of the memory's initialization signature, and note an interconnect defect if not.

Figure 8:
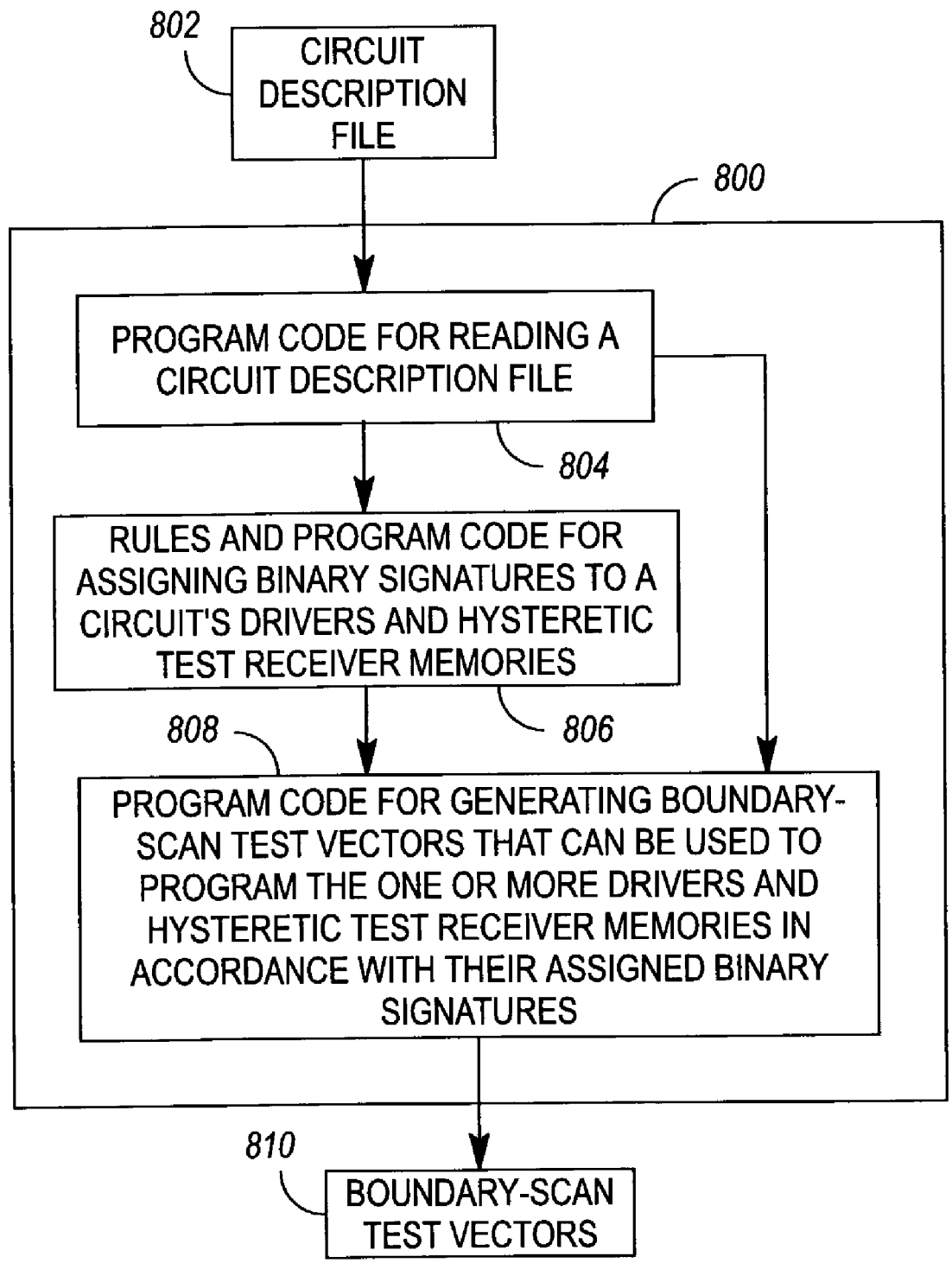
FIG. 8 illustrates an exemplary embodiment of apparatus for generating Boundary-Scan test vectors.

In accordance with the method for generating Boundary-Scan test vectors illustrated in FIG. 3, FIG. 8 illustrates apparatus for generating Boundary-Scan test vectors. The apparatus is embodied in computer readable program code 804, 806, 808 stored on a number of computer readable media 800. The computer readable program code 804 comprises code for reading a circuit description file 802, rules and code 806 for assigning binary signatures to a circuit's drivers and hysteretic test receiver memories, and code 808 for generating Boundary-Scan test vectors 810. The circuit description file 802 describes a circuit comprising one or more drivers and one or more hysteretic test receiver memories. The rules 806 may be more or less complex, but at least require the assignment of different binary signatures to a corresponding driver and hysteretic test receiver memory. The code 808 for generating Boundary-Scan test vectors 810 generates vectors that can be used to program the one or more drivers and one or more hysteretic test receiver memories of a circuit in accordance with their assigned binary signatures.

In alternate embodiments of the FIG. 8 apparatus, the rules 806 maintained as part of the program code are more complex. For example, the rules 806 may specify that each hysteretic test receiver memory described in the circuit description file be assigned a binary signature that is the complement of a sequence of states that is expected to be captured from the first hysteretic test receiver memory during the capture phase of subsequent Boundary-Scan testing. Alternately (or additionally), the rules 806 may specify that each hysteretic test receiver memory described in the circuit description file be assigned a binary signature that differs from the binary signatures assigned to all other drivers and hysteretic test receiver memories described in the circuit description file.

While illustrative and presently preferred embodiments of the invention have been described in detail herein, it is to be understood that the inventive concepts may be otherwise variously embodied and employed, and that the appended claims are intended to be construed to include such variations, except as limited by the prior art.

What is claimed is:

1. A method for evaluating a circuit assembly under test for interconnect defects, comprising:
   a) assigning different binary signatures to each of a plurality of drivers and hysteretic test receiver memories of the circuit assembly under test;
   b) generating a series of Boundary-Scan test vectors wherein each test vector comprises corresponding bits of the different binary signatures;
   c) shifting the test vectors into the circuit assembly under test;

d) after shifting each test vector into the circuit assembly under test,
   i) launching the test vector; and
   ii) capturing a state from each of the hysteretic test receiver memories; and
e) evaluating the circuit assembly under test for interconnect defects by comparing i) sequences of states captured from the hysteretic test receiver memories to ii) one or more of the different binary signatures.

2. The method of claim 1, wherein the binary signature assigned to a first hysteretic test receiver memory is the complement of a sequence of states that is expected to be captured from the first hysteretic test receiver memory as the series of test vectors is launched.

3. Apparatus for generating Boundary-Scan test vectors, comprising:
a) a number of computer readable media; and
b) computer readable program code stored on the number of computer readable media, the computer readable program code comprising:
   i) code for reading a circuit description file that describes a circuit comprising a plurality of drivers and hysteretic test receiver memories;
   ii) rules and code for assigning binary signatures to a circuit's drivers and hysteretic test receiver memories; the rules at least requiring the assignment of different binary signatures to each of the plurality of drivers and hysteretic test receiver memories in the circuit description file; and
   iii) code for generating Boundary-Scan test vectors that can be used to program the drivers and hysteretic test receiver memories in accordance with their assigned binary signatures.

4. The apparatus of claim 3, wherein the rules for assigning binary signatures specify that each hysteretic test receiver memory described in the circuit description file be assigned a binary signature that is the complement of a sequence of states that is expected to be captured from the first hysteretic test receiver memory during the capture phase of subsequent Boundary-Scan testing.

5. Apparatus for evaluating a circuit assembly under test for interconnect defects, comprising:
a) a number of computer readable media; and
b) computer readable program code stored on the number of computer readable media, the computer readable program code receiving i) a set of unique binary signatures comprising data signatures assigned to drivers, and initialization signatures assigned to hysteretic test receiver memories, of the circuit assembly under test, wherein all of the binary data and initialization signatures differ, and ii) a set of binary signatures captured from the hysteretic test receiver memories during Boundary-Scan testing; said code evaluating the circuit assembly under test for interconnect defects by comparing each of the captured binary signatures to one or more of the different binary data and initialization signatures.

6. The apparatus of claim 5, wherein the computer readable program code compares the binary signature captured from a hysteretic test receiver memory to the unique binary data signature for a corresponding driver, and notes an interconnect defect if the two signatures do not match.

7. The apparatus of claim 5, wherein the computer readable program code compares the binary signature captured from a hysteretic test receiver memory to the unique binary data signatures for one or more drivers, and notes a short if any two signatures match.

8. The apparatus of claim 5, wherein the computer readable program code compares the binary signature captured from a hysteretic test receiver memory to the unique binary initialization signatures for one or more other hysteretic test receiver memories, and notes a short if any two signatures match.

9. The apparatus of claim 5, wherein the computer readable program code compares the binary signature captured from a hysteretic test receiver memory to the unique binary initialization signature for the hysteretic test receiver memory, and notes an open if the two signatures match.

10. The apparatus of claim 5, wherein the computer readable program code determines if the binary signature captured from a hysteretic test receiver memory is the complement of the unique binary initialization signature for the hysteretic test receiver memory, and notes an interconnect defect if not.

* * * * *